United States Patent [19]

Beitman

[11] Patent Number: 5,385,487
[45] Date of Patent: Jan. 31, 1995

[54] APPARATUS FOR ELECTRICALLY OPERATING DEVICES IN A CONTROLLED ENVIRONMENT

[75] Inventor: Bruce A. Beitman, Allentown, Pa.
[73] Assignee: AT&T Corp., Murray Hill, N.J.
[21] Appl. No.: 114,403
[22] Filed: Aug. 30, 1993
[51] Int. Cl.⁶ .................................... H01R 13/60
[52] U.S. Cl. ................... 439/540; 439/549; 439/544; 361/727
[58] Field of Search ............. 439/540, 544, 548, 549, 439/552, 559; 361/608, 725, 727, 796; 73/865.8, 865.6

[56] References Cited

U.S. PATENT DOCUMENTS

| | | |
|---|---|---|
| 4,397,513 | 8/1983 | Clark et al. .................. 439/76 X |
| 4,399,487 | 8/1983 | Neumann .................. 361/727 X |
| 4,409,641 | 10/1983 | Jakob et al. .................. 439/76 X |
| 4,958,257 | 9/1990 | Wenke .................. 361/796 X |
| 4,962,444 | 10/1990 | Niggemann .................. 361/796 X |
| 5,119,270 | 6/1992 | Bolton et al. .................. 361/725 X |

Primary Examiner—Larry I. Schwartz
Assistant Examiner—Daniel Wittels

[57] ABSTRACT

A chamber, e.g., an oven, has open access ports through a wall thereof opening into the chamber. Cooperating with the access ports are a number of mounting assemblies each comprising a front section, for disposition within the chamber via the access port, and a rear section for extending exteriorly of the chamber. Device receiving sockets are mounted on the front section and electrical plug receiving sockets are mounted on the rear section. The front and rear sockets are electrically wired together for applying electrical power to the devices on the front section. An intermediate member is disposed between the front and rear sections providing thermal isolation therebetween and providing means for sealing the access ports when a mounting assembly is disposed therethrough. Variable socket to socket wiring means are also provided.

16 Claims, 5 Drawing Sheets

APPARATUS FOR ELECTRICALLY OPERATING DEVICES IN A CONTROLLED ENVIRONMENT

Background of the Invention

This invention relates to apparatus for electrically operating devices, e.g., semiconductor devices, within a controlled environment, e.g., at an elevated or reduced temperature, or in a corrosive atmosphere, or the like.

There are many instances, particularly for testing purposes, where it is desirable to electrically operate devices within a controlled environment. One example is the accelerated life testing of semiconductor devices in which the devices are operated at extreme conditions, e.g., high electrical power and high ambient temperature, until such time as the devices fail. By such means, much information can be obtained within relatively short time periods about the life expectancy of the devices under normal operating conditions and the types of failure modes they will eventually experience.

Such accelerated life testing is performed by mounting the devices being tested on sockets mounted on wired mounting boards, and disposing the mounting boards with an oven with electrical wires extending from the mounting board outwardly of the oven to a source of electrical power for the devices being tested.

One prior art arrangement for performing such testing comprises an oven having a front panel containing a plurality of access ports or passageways extending entirely through the front panel and opening into the oven. A plurality of wired mounting boards, e.g., flat plates of steel, are provided having front and rear sections. Mounted on the front sections are a plurality of sockets for receipt of devices to be tested. Mounted on the rear sections are a plurality of sockets hard wired to the front section sockets. Disposed intermediate the front and rear sections, and in tight fit around the steel plate, is a collar of insulating material shaped to fit snugly within the oven access ports. In use, devices to be tested are mounted on the front section sockets and electrical plugs, connected via bus bars to sources of electrical power, are plugged into the rear section sockets whereby electrical power is applied to the devices being tested. The loaded front section of a mounting board is then inserted into the oven through an open access port, and the collar surrounding the socket mounting plate is inserted into the access port to completely seal the port.

Advantages of such prior an arrangement are that the mounting boards can be used for various testing purposes even when the boards are not disposed within the oven, and different devices under test can be inserted into and withdrawn from the oven without interfering with the testing of other devices within the oven.

The present invention provides various improvements over the above-described prior art arrangement and solves certain problems associated therewith. I have discovered, for example, that in the prior art mounting boards, a temperature gradient exits along the lengths of the steel plates whereby different devices mounted in different sockets spaced along the lengths of the front sections experience different ambient temperatures, hence different testing conditions. This is generally undesirable because it is required that all the devices on each mounting board be tested under identical conditions. This problem is solved according to this invention.

Another problem of the described prior an arrangement is that, because of heat conducted through the steel plate of the prior an mounting boards, the sockets mounted on the rear sections of the boards, i.e., the sections extending exteriorly of the oven, become very hot. This, in turn, requires the use of special purpose, expensive sockets on the rear sections which can withstand elevated temperatures. This requirement is eliminated in accordance with this invention.

SUMMARY OF THE INVENTION

In accordance with this invention, there is provided apparatus similar to the prior an apparatus previously described and including a controlled environment chamber, e.g., an oven, having a side wall including an open access port therethrough, and a wired mounting board for disposing electrically powered devices within the chamber through the access port. The mounting board includes a front section for disposition within the chamber and a rear section for extending exteriorly of the chamber.

In accordance with one aspect of the invention, the front and rear sections of the mounting board are spaced apart by an intermediate member to which the front and rear sections are secured. The intermediate member is of a thermally insulating material and is solid except for electrical wires passing therethrough which electrically interconnect sockets on the front section to sockets on the rear section.

The intermediate member fits snugly within the access port to thermally seal it as well as providing thermal isolation between the front and rear sections of the mounting board.

In accordance with a second aspect of the invention, the rear section of each mounting board includes spaced apart portions providing a passageway open to free passage of room air therethrough. Electrical wires extending between the sockets on the front and rear sections pass through the passageway and are exposed to air flowing through the passageway. The flowing air cools the wires and prevents excessive heating of the rear section sockets by heat otherwise conveyed by the wires from the oven interior.

In accordance with a third aspect of the invention, the access port has a counter-bored or recessed configuration including outer and inner aperture encircling surfaces. The intermediate member of the mounting board is provided with a front gasket to seal against the inner aperture surface and a rear gasket to seal against the outer aperture surface. This dual gasket arrangement, in combination with the recessed access port, provides a simple means for firmly receiving and supporting the mounting board within the access port while completely sealing the access port. In one embodiment, set screws are used to press the mounting assembly inwardly of the access port for firmly clamping the gaskets against their mating surfaces.

In accordance with a fourth aspect of the invention, a wiring interface region is included on the mounting board. Disposed on the interface region are a pair of edge connectors, one of which is wired to one or more sockets on the front section, and the other of which is wired to one or more sockets on the rear section. Each of the edge connectors has a plurality of terminals, and the terminals of the two edge connectors are electrically interconnected by means of an interchangeable connector board. The connector board includes two spaced apart groups of terminals, with each group of terminals mating with the terminals of a respective edge connector. Different connector boards are provided having different electrical connecting patterns between the two groups of terminals on the connector boards, whereby, depending upon the connector board used, different wiring connection patterns can be provided between a socket or sockets on the front section and a socket or sockets on the rear section of the mounting plates.

DESCRIPTION OF PREFERRED EMBODIMENTS OF THE INVENTION

The invention is described in the context of an enclosed oven by means of which various electrical devices, e.g., semiconductor devices having extending terminal leads, can be electrically life tested at elevated ambient temperatures. The invention is not limited to ovens, but can be used with different chambers providing different controlled environments.

Figure 1:
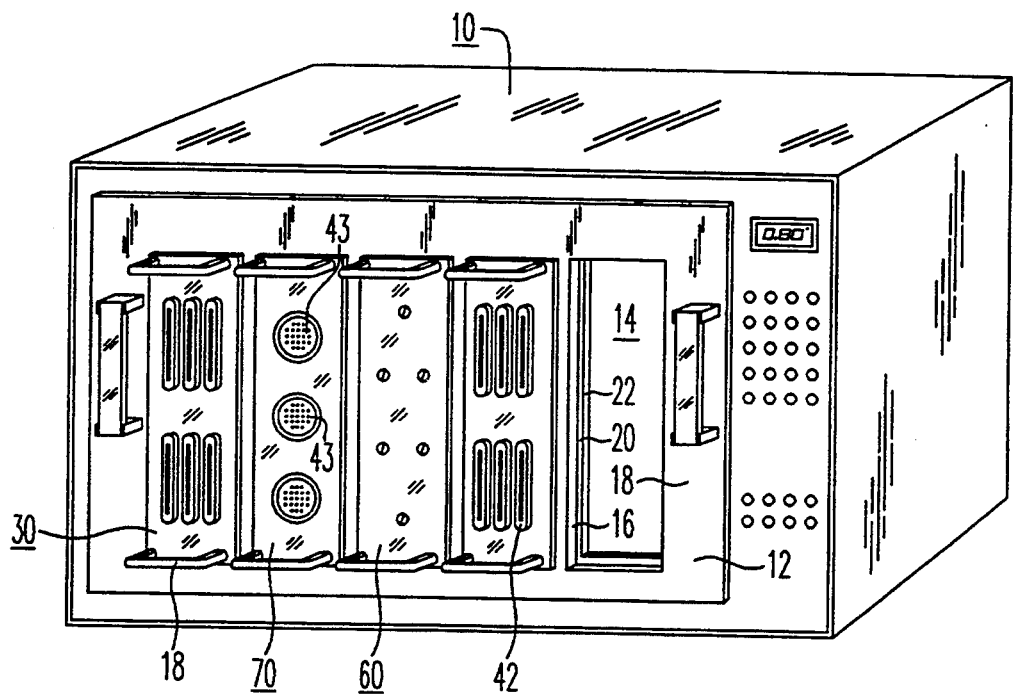
FIG. 1 is a view, in perspective, of an oven having access ports all but one of which are sealed by dummy and device mounting units in accordance with this invention.
Figure 2:
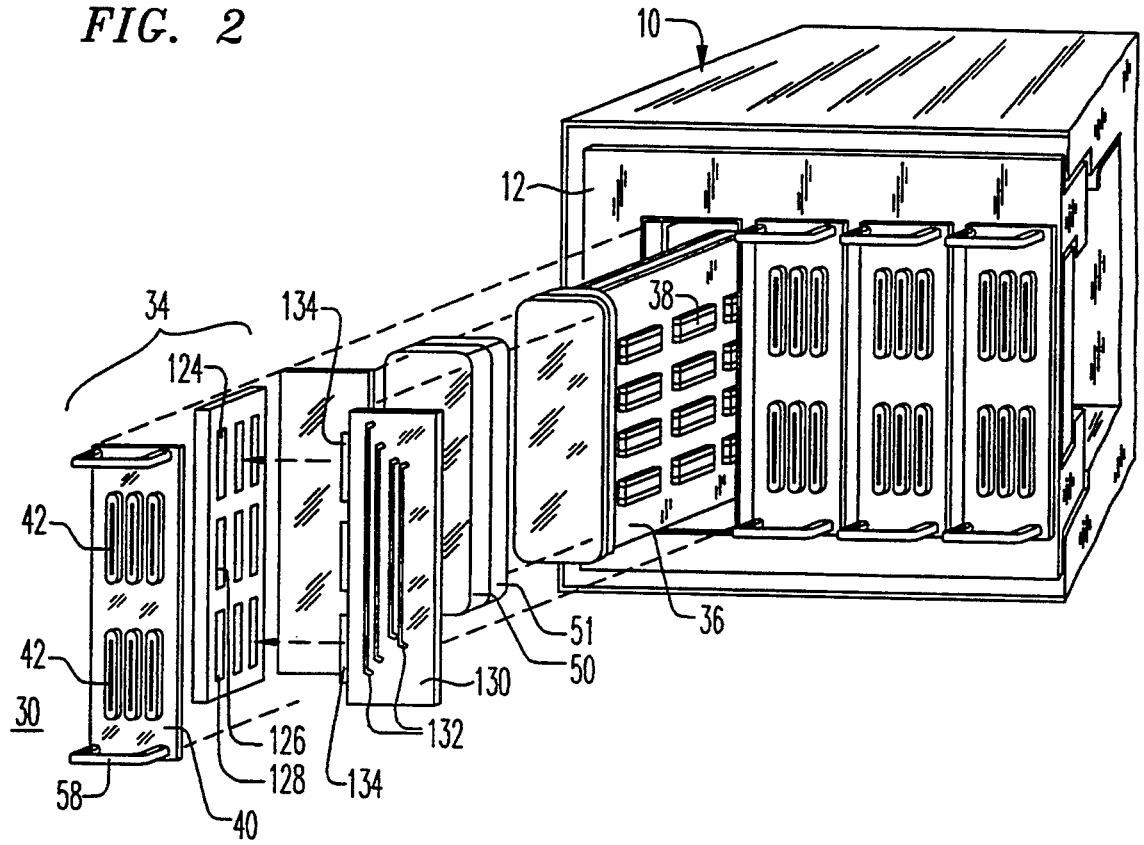
FIG. 2 is a view of a portion of the oven shown in FIG. 1 showing, partially exploded and partially schematically, a device mounting assembly used with the oven.
Figure 3:
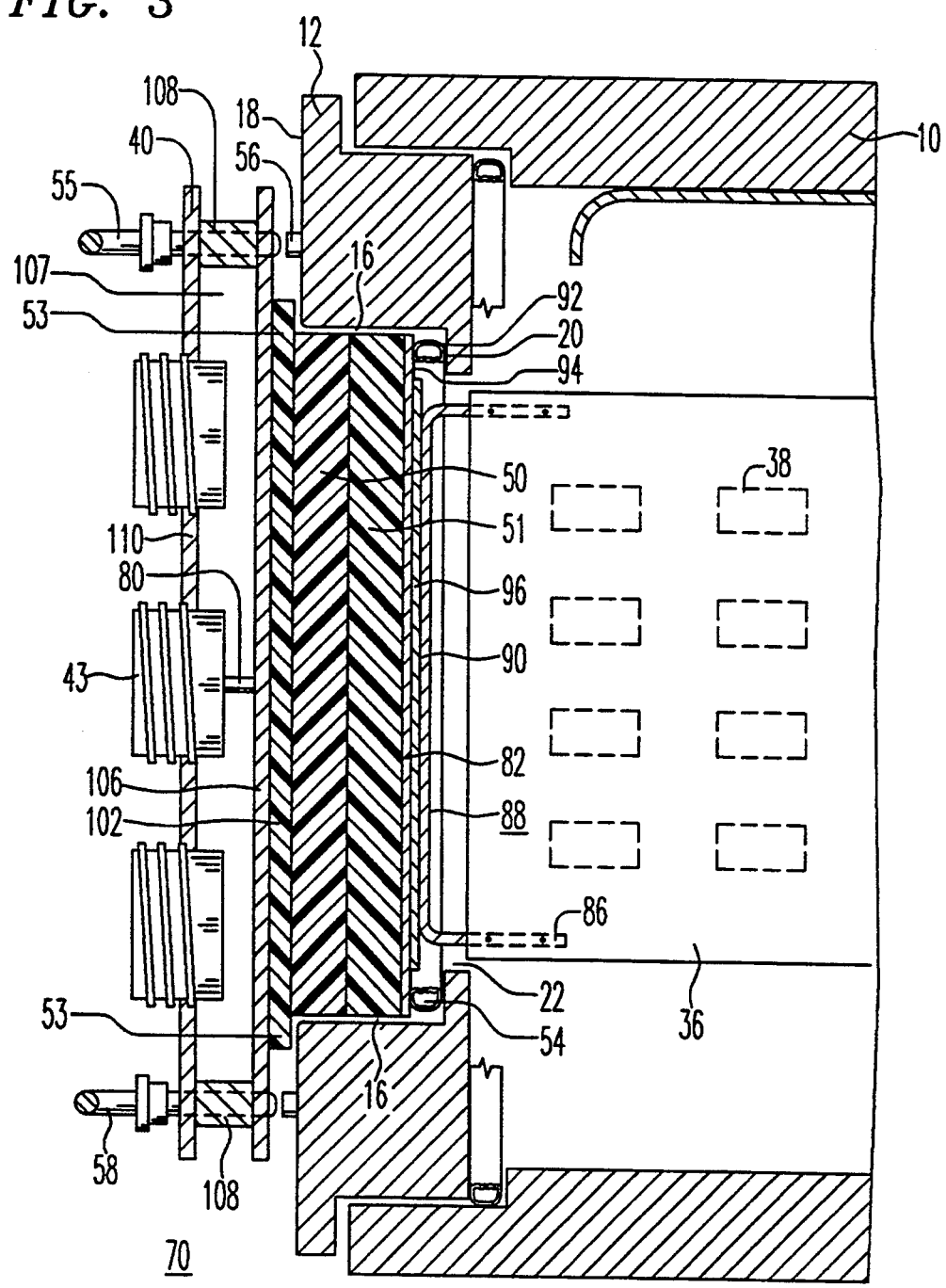
FIG. 3 is a cross sectional view through an access port of the oven showing details of the access port and of a device mounting assembly extending into the oven through the access port.

FIGS. 1, 2 and 3 show components of the present inventive apparatus.

An oven 10 (in this embodiment) of known design is provided including a front door 12 having, according to the invention, a number of open access ports 14 therethrough. In FIG. 1, only one access port 14 is visible, the other ports being closed by various mounting assemblies 30, 60 and 70 described hereinafter. Each access port 14 has a counter-bored or recessed configuration including an outer passageway 16 extending from an outer surface 18 of the front door 12 to an intermediate wall or shoulder 20, and an inner passageway 22 extending from the shoulder 20 to an inner surface 24 (FIG. 3) of the door 12. The inner passageway 22 opens into the interior of the oven 10.

Used in combination with the access ports 14 are a plurality of device mounting assemblies 30 and 70, each having (FIGS. 5 and 7) a "front" section 32 and a "rear" 34 section. The front sections 32 of the mounting assemblies extend into the oven 10 through the access ports 14 and the rear sections 34 extend exteriorly of the oven 10. FIG. 2 shows one of the mount assemblies 30. FIG. 3 shows another of the mount assemblies 70. The present discussion, somewhat general in nature, applies to features which are common to both mount assemblies 30 and 70. Additional features of these mount assemblies are described hereinafter.

The front section (FIGS. 2 and 3) of the mount assemblies comprises a plate 36 having a number of sockets 38, of known design, mounted thereon for receipt of electrical devices to be tested. The rear section 34 comprises a panel 40 having mounted thereon a number of sockets (identified by reference numerals 42 and 43 on the mounting assemblies 30 and 70, respectively). The sockets receive known type electrical plugs (e.g., plug 44 shown in FIG. 4) at the ends of cables 46 connected to sources (not shown) of electrical power and various device driving and measuring signals. Various arrangements for powering devices used with the inventive apparatus are known and not described herein.

The sockets 42 and 43 on the rear sections 34 are electrically connected to respective sockets 38 on the front sections 32 by fixed or variable wiring arrangements (described hereinafter) whereby electrical power and electrical signals applied via the sockets 42 and 43 on the rear sections 34 are applied to the terminal leads of semiconductor devices mounted within the sockets 38 on the front sections.

The front and rear sections of each mounting assembly are interconnected by means of intermediate, rigid blocks 50 and 51 of a thermal insulating material, e.g., a commercially available ceramic material sold under the trade name "Maranite." Other known thermal insulating materials used as structural members in ovens, kilns, furnaces and the like can be used.

The blocks 50 and 51 are dimensioned to fit relatively snugly within the outer passageway 16 of the access ports 14, and gaskets 53 and 54 (FIG. 3; also, FIGS. 5 and 7) are provided for engagement with the access port surfaces 18 and 20. By "snug fit" is meant that the blocks 50 and 51 substantially fill the aperture port outer passageway 16 for substantially sealing it against heat loss, but sufficient clearance is provided so that the mounting assemblies can be freely inserted and withdrawn from the access ports 14. With blocks 50 and 51 having cross-sectional dimensions of 67 and 240 mm, the total nominal clearance between the sides of the blocks 50 and 51 and the wall of the outer passageway 16 of the access ports 14 is around 7 mm.

Handles 58 are provided on the rear panel 40 for ease of handling the mounting assemblies and particularly for pulling them out of the access ports 16.

In a preferred embodiment, set screws 55 (FIG. 3) are provided extending through the rear panel 40 and engagable with threaded studs 56 mounted on the oven door 12. When the mounting assemblies are inserted into the aperture ports, the leading ends of the set screws 55 enter the studs 56 and, upon screwing the screws into the studs, the mounting assemblies are firmly pressed into the aperture ports for firmly seating the gaskets 53 and 54 against their mating surfaces 18 and 20, respectively. The screws 55 are disposed within the handles 58 to allow turning the screws while the assembly is being held by the handles and being inserted into the access port 14.

The combination of the snug fit of the blocks 50 and 51 within the outer passageway 16 and the engagement of the gaskets 53 and 54 against the passageway surfaces 18 and 20, respectively, effectively seal the access ports and prevent any significant amount of heat loss through the access ports.

Two blocks 50 and 51, secured together by screws, for example, are used simply because of the commercial availability of the Maranite insulating material in certain dimensions. A single block intermediate member also can be used.

One advantage of the inventive apparatus is that, because of the effective sealing of the access ports by the mounting assemblies, different mounting assemblies containing groups of devices being tested can be periodically inserted and removed from the oven without significantly changing the conditions, e.g., the temperature, within the oven. This greatly enhances the utility and flexibility of use of the oven in the simultaneous testing of different groups of devices.

Another advantage of the inventive apparatus is that, because of the use of the intermediate block or blocks 50 and 51 of thermal insulating material disposed between the front 32 and rear 34 sections of each of the mounting assemblies, a highly effective barrier against heat flow between the front and rear sections is provided. By avoiding such heat flow, a temperature gradient along the front section is avoided and all the devices mounted along the length of the front section experience the same ambient test temperatures.

In the prior art arrangement previously described, the front and rear sections of the mounting assemblies comprise portions of a continuous plate of steel, and a collar of insulating material surrounding the steel plate is used to seal the access ports. The steel plates, however, are good conductors of heat and conduct heat from the front sections to the rear sections, and the resulting thermal gradients along the lengths of the front sections give rise to undesirable differences in ambient testing temperatures.

In the use of the apparatus, there are occasions when not all the access ports are in use, and for thermally sealing these unused ports, while still providing quick access thereto, "dummy" mounting assemblies 60 (FIG. 1) are provided. Such assemblies 60 comprise simply the blocks 50 and 51 of insulating material and the gaskets 53 and 54 thereon, and the panel 40 to which the blocks 50 are connected. No front section is provided, and no sockets are included on the front panel 40.

The mounting assemblies are now described in greater detail.

Figure 5:
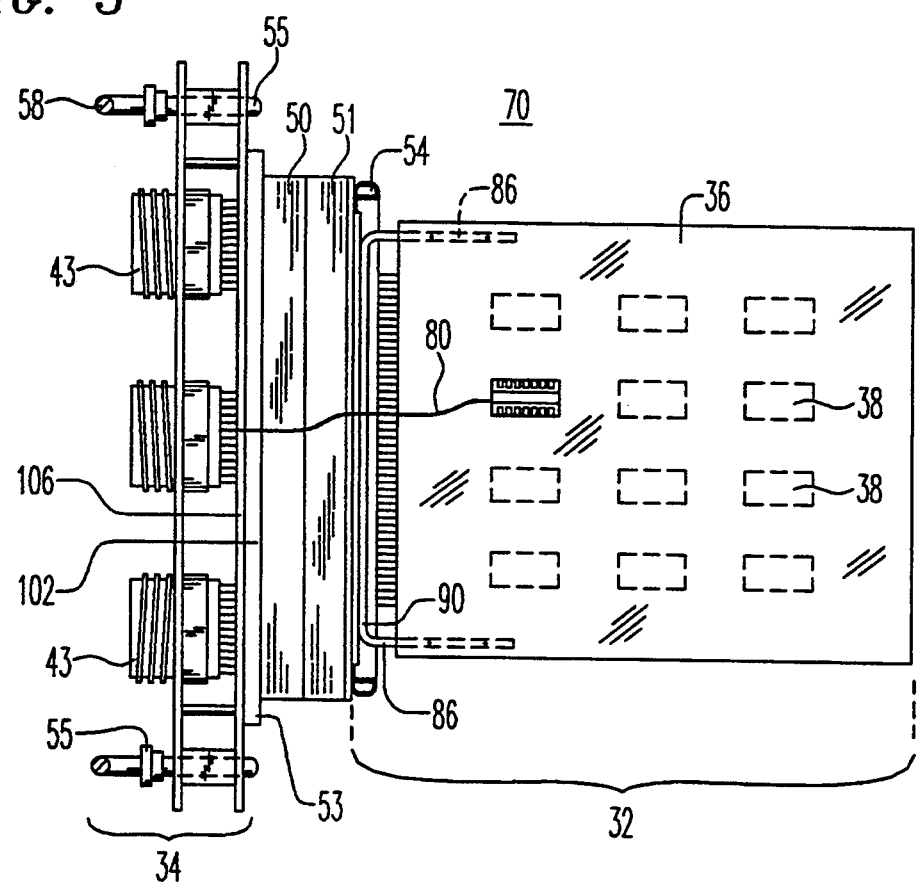
FIG. 5 is a side elevation of one device mounting assembly in accordance with this invention.
Figure 6:
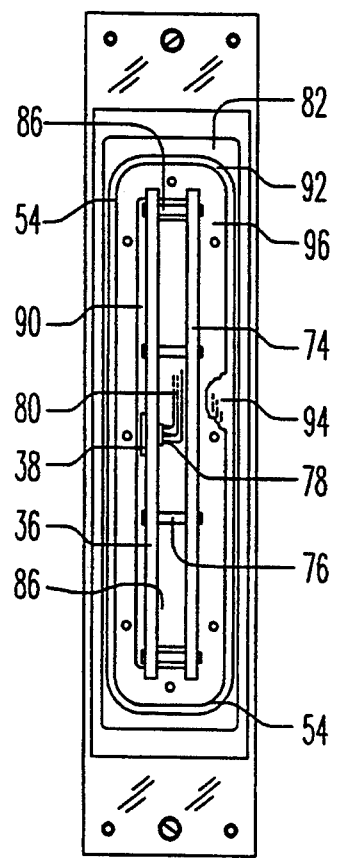
FIG. 6 is an end view, looking from the fight-hand side, of the front section of the device mounting assembly shown in FIG. 5.

With respect to FIGS. 3, 5 and 6, the mounting assembly 70 comprises the previously described front 32 and rear 34 sections interconnected by the blocks 50 and 51 of insulating material. The front section 32 comprises a pair of parallel plates 36 and 74 of, e.g., steel, connected together in spaced apart relation by means of short metal posts 76. A number of sockets 38 (of known type and shown merely by rectangles in FIG. 3) are fixedly mounted within openings through the plate 36 and have terminal pins 78 extending into the space between the two plates. The socket terminal pins 78 are connected to the ends of insulated wires 80 which extend, within the space between the two plates, to and through the otherwise solid blocks 50 and 51. In FIG. 5, only one such fully extending wire 80 is shown.

The two plates 36 and 74 are rigidly secured to each other and to the front block 51 by known fastening means. In this embodiment, a flat metal plate 82 (FIGS. 3 and 6) is secured to the front surface of the front block 51, and the legs 86 of a U-shaped bracket 88 are screwed to the parallel plates 36 and 74. The bight 90 of the bracket 88 is screwed to the plate 82.

An encircling gasket 54 of, e.g., rubber, is mounted on the front block 51 along the periphery of the front surface thereof. The gasket 54 comprises (FIG. 3) a tubular, annular member 92 integrally connected along the outer edge of a central, flat layer 94. For firmly securing the gasket 54 to the block 51, the gasket central layer 94 is clamped against the plate 82 by a plate 96 overlying the gasket central layer 94 and screwed to the plate 82.

Mounted on the rear surface of the rear block 50 is a flat layer 102 of gasket material, e.g., rubber. A peripheral portion of the layer 102 extends beyond the periphery of the rear surface of the rear block 50 and comprises the aforementioned gasket 53.

The gasket layer 102 is clamped against the rear block 50 by means of a rigid plate 106 of, for example, a known plastic material screwed to the rear block 50. The gasket layer 102, in addition to forming the gasket 53, provides additional thermal insulation between the front 32 and rear sections 34 of the assembly 70.

Mounted on the clamping plate 106, and spaced therefrom by means of spacer blocks 108, e.g., of metal, is the aforementioned socket panel 40, e.g., a plate of metal. The socket panel (plate) 40 has openings therethrough in which are fixedly mounted the rear sockets 43. The rear sockets extend into the space 107 between the two plates 106 and 40, and insulated wires 80 extend from terminals of the rear sockets 43 through the space 107 between the plates and through the plate 106. From plate 106, the wires 80 extend (FIG. 5) through the gasket layer 102, the blocks 50 and 51, the front section mounting plates 82, 96 and 90 and the gasket layer 94, and then to the front sockets 38. The space 107 between the two plates 106 and 40 is not otherwise enclosed, and the space 107 is open (FIG. 3) to the ambient air.

The set screws 55 previously described extend loosely through the spacer blocks 108 and through the clamping plate 106 for entry into the studs 56.

The mounting assembly 70 is used as previously described. During such use, heat transfer from the front section 32 to the rear section 34 and outwardly along cables 46 (FIG. 4) connected to the rear sockets 43 is further reduced by the spaced relationship between the two plates 106 and 40 of the rear section 34. As previously noted, the space 107 between the plates is open to the surrounding air and room air passes between the plates by convection. The flowing air cools both plates 106 and 40 and the various electrical wires 80 passing through the space 107. The cooling air significantly reduces the amount of heat which would otherwise be conducted to the rear section sockets 43 by the wires. An important advantage of this is that the sockets 43 need not be special purpose, high temperature resistant sockets. This greatly reduces the cost of the mounting assemblies.

Figure 7:
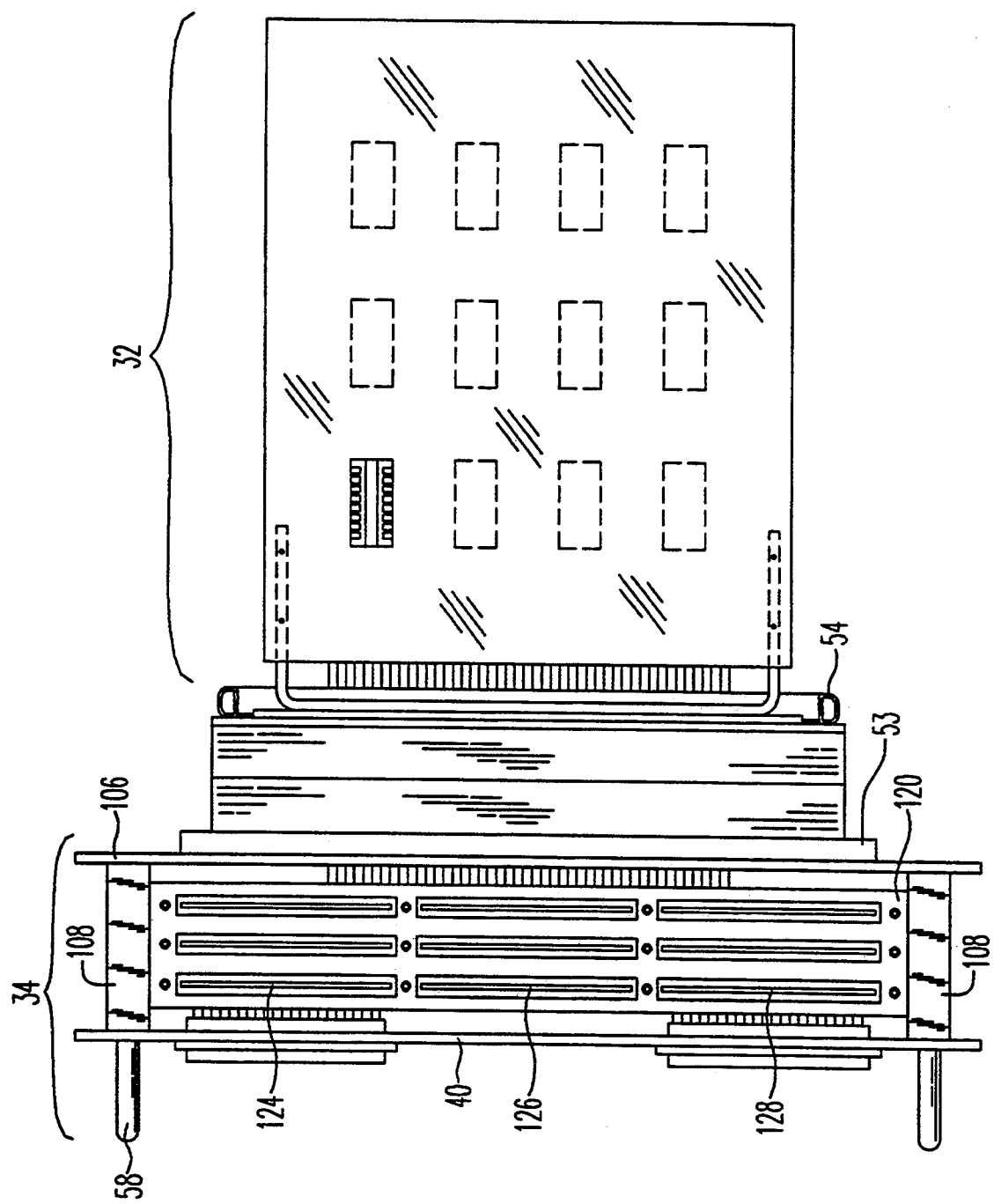
FIG. 7 is a side elevation of another device mounting assembly in accordance with this invention.

Additional details of the mounting assemblies 30 are now provided in connection with FIGS. 2 and 7.

The mounting assembly 30 is substantially identical to the mounting assembly 70 except that the rear section 34 of the assembly 30 includes a wiring interface region comprising an intermediate plate 120, e.g., of metal, disposed between the rear section parallel plates 106 and 40 and perpendicular thereto. The plate 120 is secured to the two spacer blocks 108.

Mounted on the intermediate plate 120, e.g., by fixedly extending through holes through the plate 120, are three groups of edge connectors, each group containing three edge connectors 124, 126 and 128 in vertical alignment. The edge connectors are of known type and are basically sockets having extending terminal pins and a recess for receipt of a connector board 130 (FIG. 2) having printed circuit conductive paths 132 thereon for electrical engagement with respective terminal pins of the edge connectors.

Thus, as shown in FIG. 2, edge projections 134 of the connector boards 130 extend into respective edge connectors 124, 126 and 128 of a group of edge connectors, whereby the different terminal pins of the three edge connectors are electrically interconnected to one another in accordance with the pattern of the conductive paths 132 on the connector boards (the various paths 132 each having ends which extend onto the edge projections 134).

Figure 4:
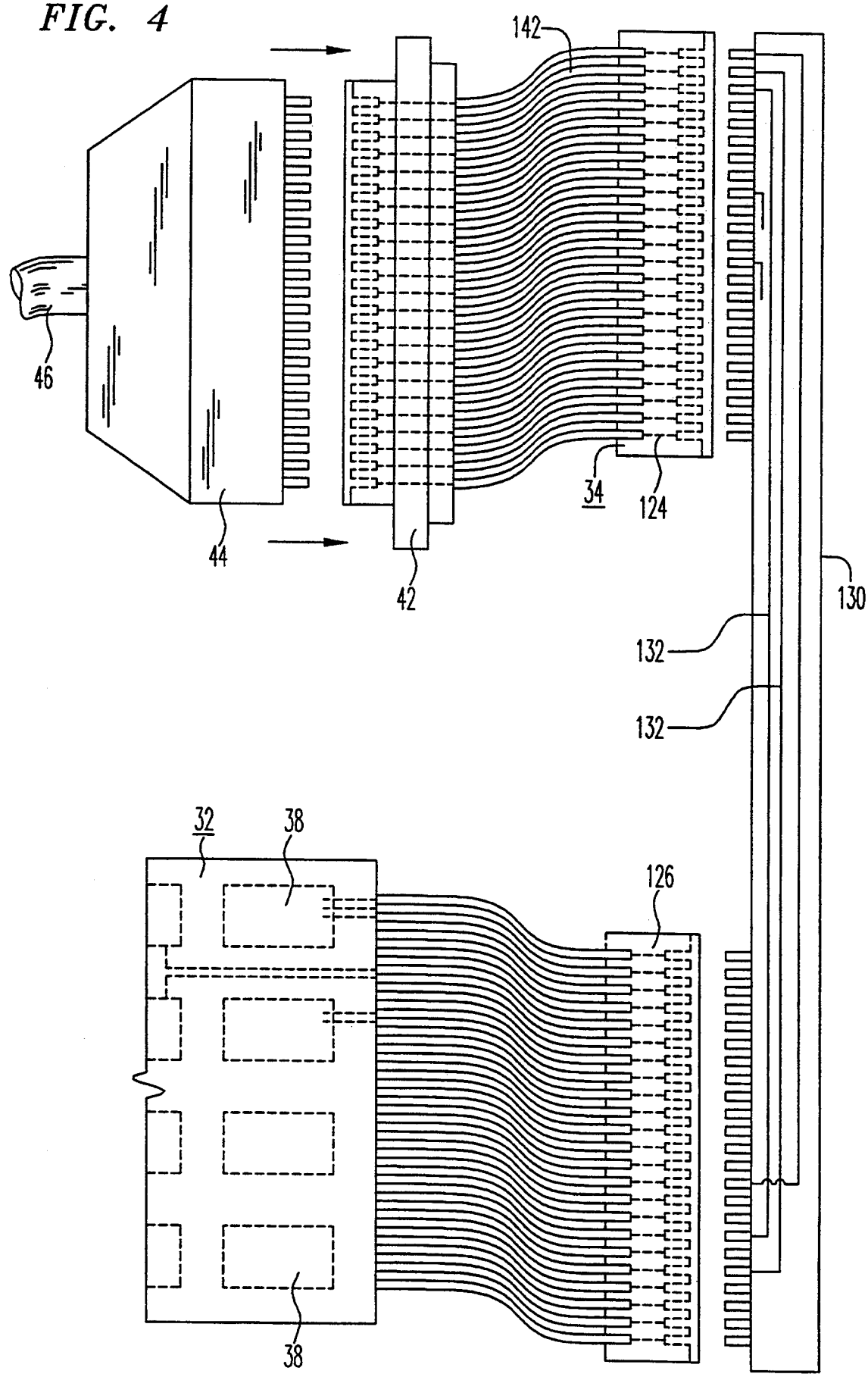
FIG. 4 is a schematic view illustrating an arrangement for electrically connecting individual pins of an external plug, connected to a power supply, to individual pins of respective device receiving sockets mounted on a front panel of a device mounting assembly.

FIG. 4 is a schematic illustration of one use of the wiring interface region of the mounting assembly 30. In this example, only two edge connectors 124 and 126 are used. Also, for ease of drawing, the front section 32, shown at the bottom of the figure, is rotated 180° from its actual position relative to the rear section 34 shown at the top of the figure.

The rear section 34 includes a rear socket 42 for receipt of a plug 44 as previously described. The terminals of the socket 42 are hard wired, e.g., by a ribbon-type wiring harness 142, to respective terminals of the edge connector 124. The terminal to terminal wiring relationship between the socket 42 and the edge connector 124 is fixed and normally not variable.

Similarly, the terminals of the edge connector 126 are hard wired, in fixed relationship, to respective terminals of one or more sockets 38 on the front section 32 of the mounting assembly.

The connector board 130 interconnects the various terminals of the edge connector 124 to respective terminals of the edge connector 126 via the conductive paths 132 on the connector board. By using different connector boards 130 having different wiring patterns, different wiring connecting patterns can be provided between the sockets 42 and 38.

An advantage of this arrangement is that, with a given mounting assembly 30, different types of semiconductor devices, having different pin connections, can be mounted on the mounting assembly merely by selecting the proper connector board providing the proper electrical connections between the terminals of the front and rear sockets for properly energizing the devices being tested.

FIG. 2 shows a connector board 130 interconnecting three edge connectors 124, 126 and 128. This arrangement functions similarly to the FIG. 4 arrangement except that greater flexibility in the use of the apparatus is provided.

In one arrangement, for example, the terminals of a first rear socket 42 are hard wired to respective terminals of the edge connector 124, and the terminals of a second rear socket 42 are hard wired to respective terminals of the edge connector 128. The terminals of the edge connector 126 are hard wired to respective terminals of one or more front sockets 30. The connector board 130 connects terminals of the edge connector 124 to one set of terminals of the edge connector 126, and the terminals of the edge connector 128 to another set of terminals of the edge connector 126.

Thus, with two different sets of power and electrical signals applied via two plugs (FIG. 4) to the first and second rear sockets 42, both sets of power and electrical signals can be applied to a single one or more front sockets 38 via the edge connector 126.

Other wiring pattern variations are possible.

The invention has been described with use with an oven. Obviously, the identical apparatus can be used with a refrigerator providing reduced ambient temperature testing, and with a chamber providing a high humidity environment. Similarly, the inventive apparatus can be used as a test probe within a controlled environment chamber for monitoring the conditions either of the environment or of a workpiece being treated in the chamber. Also, in the embodiments illustrated herein, the wiring interface region is mounted on the rear section so as to be disposed exteriorly of and thermally insulated from the oven. However, where conditions permit, the wiring interface region can be mounted on the front section of the mounting board for disposition within the controlled environment chamber.

What is claimed is:

1. An apparatus for electrically operating a device within a controlled environment said apparatus comprising a chamber for providing a controlled environment and an enclosure for said chamber, said enclosure having an access port therethrough providing access to said chamber, and a mounting assembly having a front section for passage through said access port for disposition within said chamber, a rear section for extending exteriorly of said access port, and an intermediate member disposed between said front and rear sections and to which said front and rear sections are secured, said intermediate member being configured to mate with and seal said access port when said front section is disposed within said chamber, said intermediate member providing thermal insulation between said front and rear sections, a socket for receiving a device to be electrically operated, said socket being mounted on said front section, terminals on said rear section for connection to a source of electrical power for said devices, and means for interconnecting said terminals on said rear section to respective terminals on said front section socket, said access port having a counter-bored configuration providing an internal shoulder surrounding a portion of the passageway through said access port, said intermediate member having a front surface facing towards said front section, and a first gasket mounted along the outer periphery of said front surface for engagement with said internal shoulder.

2. An apparatus according to claim 1 wherein said access port opens onto an external surface of said enclosure, and a second gasket encircles a rear portion of said intermediate member for engagement with said external surface simultaneously with the engagement of said first gasket with said internal shoulder for, in cooperation with said intermediate member, sealing said access port.

3. An apparatus according to claim 1 wherein said chamber is part of an oven providing an environment of elevated temperature, and said access port provides communication between said chamber and air surrounding said apparatus.

4. An apparatus for electrically operating a device within a controlled environment said apparatus comprising a chamber for providing a controlled environment and an enclosure for said chamber, said enclosure having an access port therethrough providing access to said chamber, and a mounting assembly having a front section for passage through said access port for disposition within said chamber, a rear section for extending exteriorly of said access port, and an intermediate member disposed between said front and rear sections and to which said front and rear sections are secured, said intermediate member being configured to mate with and seal said access port when said front section is disposed within said chamber, said intermediate member providing thermal insulation between said front and rear sections, a socket for receiving a device to be electrically operated, said socket being mounted on said front section, terminals on said rear section for connection to a source of electrical power for said devices, and means for interconnecting said terminals on said rear section to respective terminals on said front section socket including a wiring interface region having first and second connector means each including first and second groups of terminals, respectively, said first group of terminals being individually wired to respective ones of said terminals on said rear section, and said second group of terminals being individually wired to respective ones of said terminals on said front section socket, and a plurality of connector boards each being removably connectable to both said connector means, each of said connector boards having a different wiring pattern thereon whereby, depending upon which of said connector boards is connected to said both connector means, different interconnecting patterns are provided between the various terminals of said first and second groups of terminals.

5. An apparatus according to claim 4, including a third connector means disposed in line with said first and second connector means, each of said connector boards comprising a flat plate including three projections for respective mating with said first, second and third connector means, said projections including conductive paths thereon for electrically connecting to the terminals in said respective connector means, and the conductive paths on each of said projections being electrically connected to the conductive paths on another of said projections.

6. An apparatus for electrically operating a device within a controlled environment said apparatus comprising a chamber for providing a controlled environment and an enclosure for said chamber, said enclosure having an access port therethrough providing access to said chamber, and a mounting assembly having a front section for passage through said access port for disposition within said chamber, a rear section for extending exteriorly of said access port, and an intermediate member disposed between said front and rear sections and to which said front and rear sections are secured, said intermediate member being configured to mate with and seal said access port when said front section is disposed within said chamber, said intermediate member providing thermal insulation between said front and rear sections, a socket for receiving a device to be electrically operated, said socket being mounted on said front section, terminals on said rear section for connection to a source of electrical power for said devices, and means for interconnecting said terminals on said rear section to respective terminals on said front section socket, said rear section comprising first and second spaced apart members providing therebetween a passageway for a heat transferring medium, and wherein said means for interconnecting said rear section terminals to said terminals on said front section socket comprise electrical wires which pass through said passageway.

7. An apparatus according to claim 6 wherein said rear section terminal are including within sockets fixedly mounted on said first member, and said terminals extending into the space between said first and second members for connection, within said space, to said electrical wires.

8. An apparatus according to claim 7 wherein said second member is secured to said intermediate member through an intervening body of thermally insulating material.

9. An apparatus according to claim 6 wherein said chamber is part of an oven providing an environment of elevated temperature, said access port provides communication between said chamber and air surrounding said apparatus, and said heat transferring medium comprises said surrounding air.

10. Apparatus according to claim 9 wherein said intermediate member comprises a block of thermally insulating material, said block having a forwardly facing surface for being disposed within said chamber and a rearwardly facing surface for being disposed exteriorly of said chamber when said front section of said mounting assembly is disposed within said chamber, said first of said spaced apart members comprising a first flat plate parallel to and secured to said rearwardly facing surface, and said second of said members comprising a second flat plate parallel to and secured to said first flat plate by spaced apart thermal insulating members.

11. A mounting assembly for use with a chamber providing a controlled environment, said chamber having an enclosure including an access port therethrough, said mounting assembly having a front section for passage through said access port for disposition within said chamber, a rear section for extending exteriorly of said access port, and an intermediate member disposed between said front and rear sections and to which said front and rear sections are secured, said intermediate member being configured to mate with and seal said access port when said front section is disposed within said chamber, said intermediate member providing thermal insulation between said front and rear sections, a socket for receiving a device to be electrically operated, said socket being mounted on said front section, terminals on said rear section for connection to a source of electrical power for said devices, and means for interconnecting said terminals on said rear section to respective terminals on said front section socket, said interconnecting means including first and second connector means having first and second groups of terminals, respectively, said first group of terminals being individually wired to respective ones of said terminals on said rear section, and said second group of terminals being individually wired to respective ones of said terminals on said front section socket, and a plurality of connectors each being removably connectable to both said connector means, each of said connectors having a different wiring pattern thereon whereby, depending upon which of said connectors is connected to said both connector means, different interconnecting patterns are provided between the various terminals of said first and second group of terminals.

12. A mounting assembly according to claim 11 including a third connector means disposed in line with said first and second connector means, each of said connectors comprising a flat plate including three projections for respective mating with said first, second and third connector means, said projections including conductive paths thereon for electrically connecting to the terminals in said respective connector means, and the conductive paths on each of said projections being electrically connected to the conductive paths on another of said projections.

13. A mounting assembly for use with a chamber providing a controlled environment, said chamber having an enclosure including an access port therethrough, said mounting assembly having a front section for passage through said access port for disposition within said chamber, a rear section for extending exteriorly of said access port, and an intermediate member disposed between said front and rear sections and to which said front and rear sections are secured, with intermediate member being configured to mate with and seal said access port when said front section is disposed within said chamber, said intermediate member providing thermal insulation between said front and rear sections, a socket for receiving a device to be electrically operated, said socket being mounted on said front section, terminals on said rear section for connection to a source of electrical power for said devices, and means for interconnecting said terminals on said rear section to respective terminals on said front section socket, said rear section comprising first and second spaced apart members providing a passageway therebetween for a heat transferring medium, and said means for interconnecting said rear section terminal to said terminals on said front section socket comprise electrical wires which pass through said passageway.

14. A mounting assembly according to claim 13 wherein said rear section terminals are included within sockets fixedly mounted on said first member, and said terminals extend into the space between said first and second members for connection, within said space, to said electrical wires.

15. A mounting assembly according to claim 14 wherein said first member is secured to said intermediate member through an intervening body of thermally insulating material.

16. A mounting assembly according to claim 13 wherein said intermediate member comprises a block of thermally insulating material, said block having a forwardly facing surface for being disposed within said chamber and a rearwardly facing surface for being disposed exteriorly of said chamber when said front section of said mounting assembly is disposed within said chamber, said first of said spaced apart members comprising a first flat plate parallel to and secured to said rearwardly facing surface, and said second of said members comprising a second flat plate parallel to and secured to said first flat plate by spaced apart thermal insulating members.

* * * * *